United States Patent [19]

Naura

[11] Patent Number: 5,886,549
[45] Date of Patent: Mar. 23, 1999

[54] DEVICE TO NEUTRALIZE AN ELECTRONIC CIRCUIT WHEN IT IS BEING POWERED OR DISCONNECTED

[75] Inventor: David Naura, Aix en Provence, France

[73] Assignee: SGS-Thomson Microelectronics S.A., Saint Genis, France

[21] Appl. No.: 792,962

[22] Filed: Jan. 24, 1997

[30] Foreign Application Priority Data

Jan. 31, 1996 [FR] France .................................. 96 01378

[51] Int. Cl.⁶ ............................................... H03K 17/22
[52] U.S. Cl. .......................................... 327/143; 327/198
[58] Field of Search .................................. 327/142, 143, 327/198, 544

[56] References Cited

U.S. PATENT DOCUMENTS

| | | | |
|---|---|---|---|
| 4,873,458 | 10/1989 | Yoshida ................................ | 307/362 |
| 5,150,186 | 9/1992 | Pinney et al. ........................ | 357/42 |
| 5,243,233 | 9/1993 | Cliff .................................... | 307/296.4 |
| 5,644,216 | 7/1997 | Lopez et al. ........................ | 323/315 |

FOREIGN PATENT DOCUMENTS

| | | | |
|---|---|---|---|
| A-0 285 033 | 10/1988 | European Pat. Off. ...... | H03K 17/22 |
| A-0 573 965 | 12/1993 | European Pat. Off. ...... | H01L 23/50 |
| A-0 665 649 | 8/1995 | European Pat. Off. ...... | H03K 17/22 |

OTHER PUBLICATIONS

French Search Report from French Patent Application 96 01378, filed Jan. 31, 1996.

*Primary Examiner*—Tuan T. Lam
*Attorney, Agent, or Firm*—Wolf, Greenfield & Sacks, P.C.

[57] ABSTRACT

The invention relates to a device to neutralize an electronic circuit when it is being powered or disconnected. It can be applied more particularly to electronic circuits powered by low voltages on the order of 1.8 volts. The device of the invention is not significantly affected by variations, due to manufacturing conditions, in the values of its components. The invention may be applied to the field of programmable electrical memories.

5 Claims, 2 Drawing Sheets

FIG_1
(PRIOR ART)
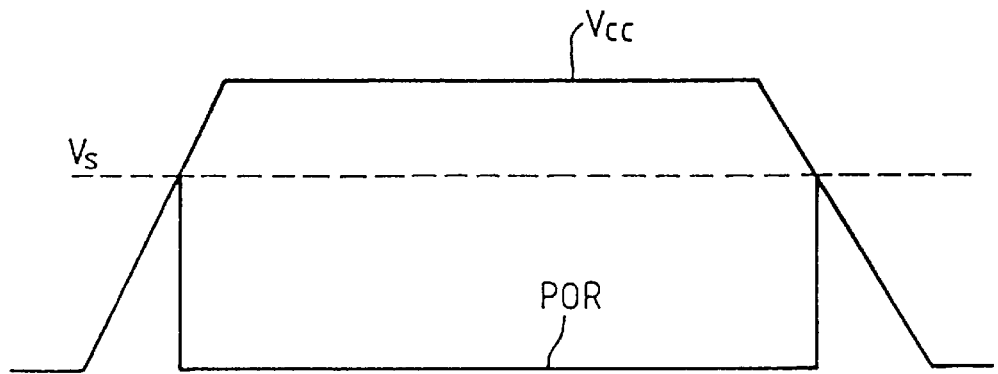
FIG_2
(PRIOR ART)
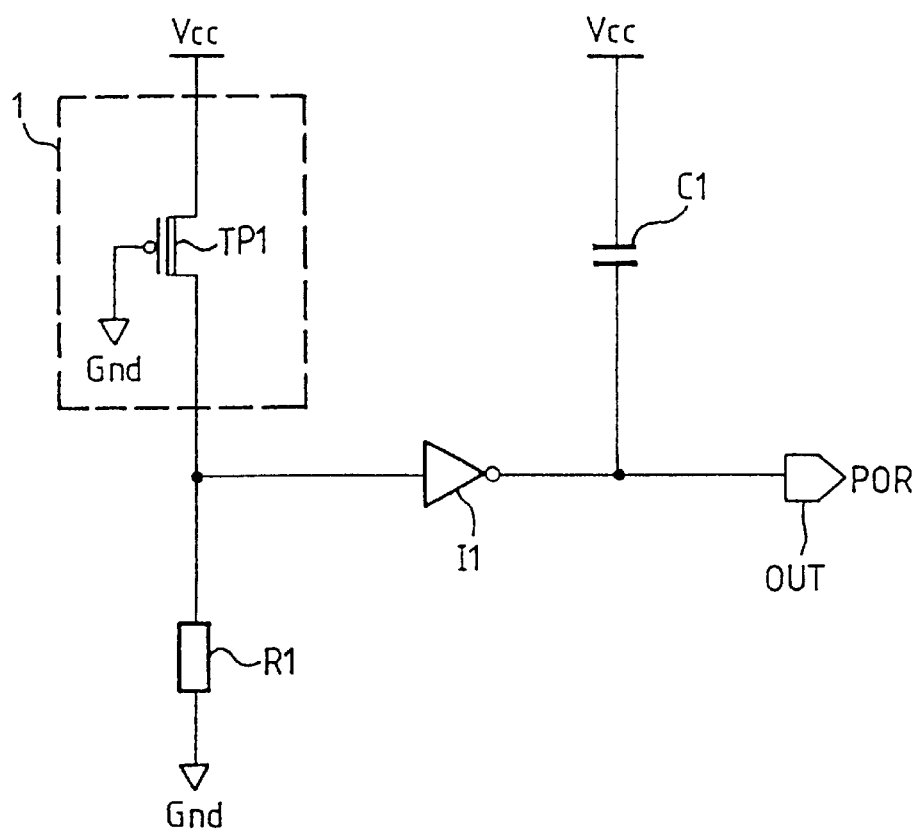

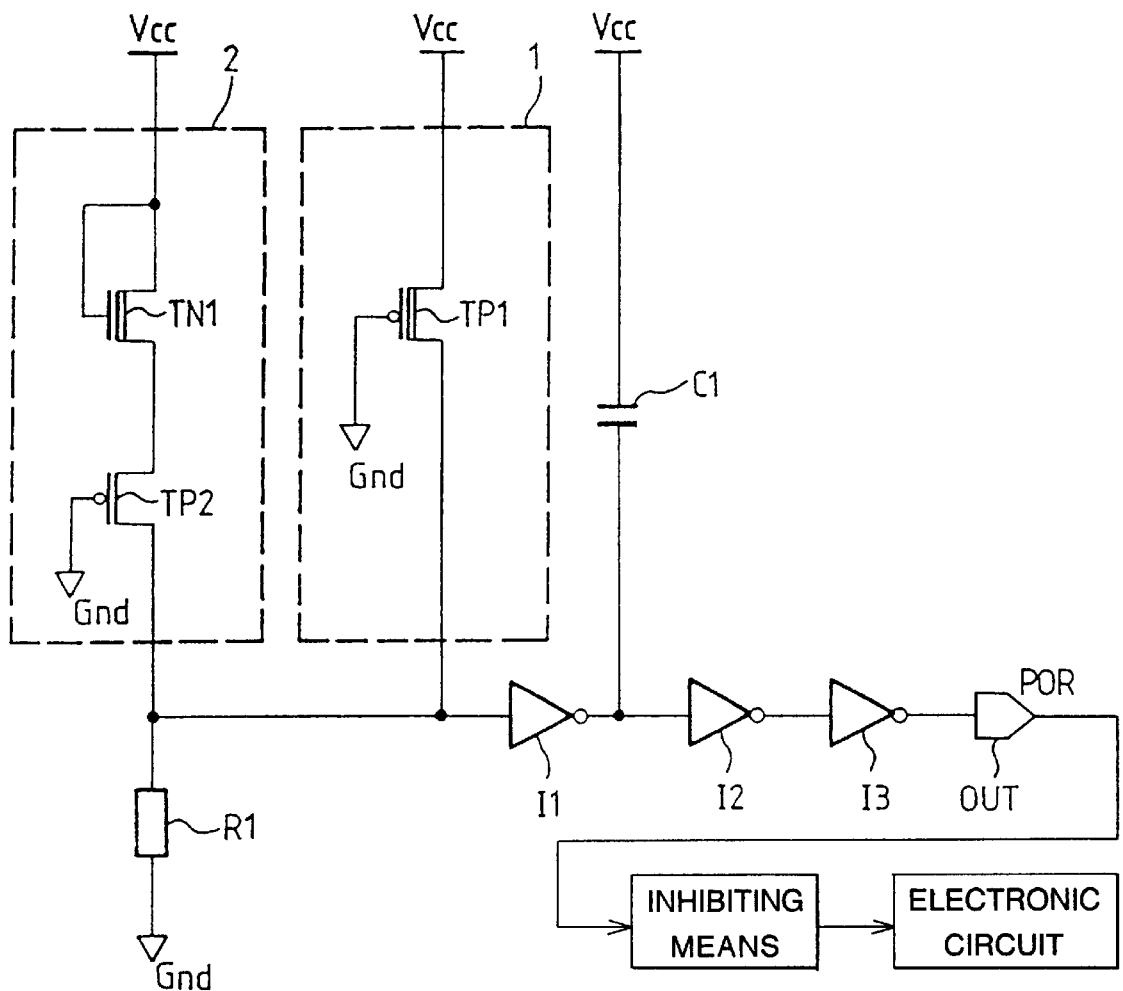
FIG_3
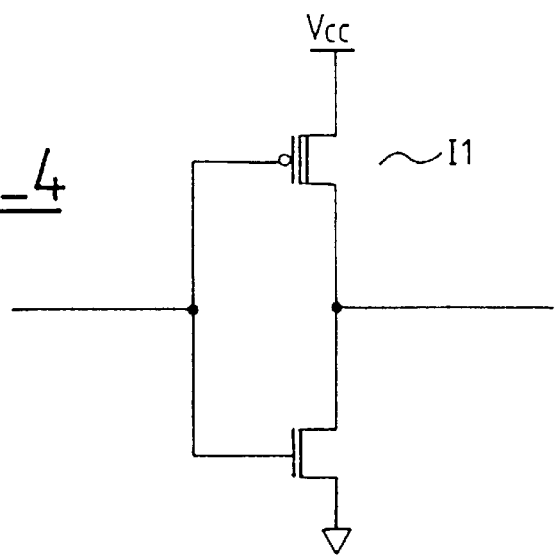
FIG_4

# DEVICE TO NEUTRALIZE AN ELECTRONIC CIRCUIT WHEN IT IS BEING POWERED OR DISCONNECTED

BACKGROUND OF THE INVENTION

1. Field of the Invention

The invention relates to a device to neutralize an electronic circuit when it is being powered or disconnected. It can be applied especially but not exclusively in the field of electric programmable memories.

The invention shall be described in the context of electrically programmable non-volatile memories (EEPROMs, Flash EPROMs), without thereby limiting the scope of the invention in any way.

When the supply voltage is being built up in a non-volatile memory, any operation of writing in the memory must be made impossible because otherwise there can be no certainty about the result of this operation. To this end, devices have been developed to neutralize the operation of the memory for values of supply voltage below a threshold value. This threshold value is generally determined as a function of the application of the electronic circuit to be neutralized.

2. Discussion of the Related Art

Prior art devices used to neutralize a non-volatile memory conventionally include a control circuit and a means to inhibit the operation of the memory. The control circuit delivers a power-on-reset (POR) signal that conditions the output of the inhibiting means.

The inhibiting means convert the POR control signal into a binary signal. When the voltage of the POR control signal is zero, the binary signal is at a high level. For any value of the supply voltage below the threshold voltage Vs, the output of the inhibiting means is at a low level. When the binary signal is at the high level, the write operations are permitted in the memory located downline with respect to the inhibiting means.

The POR control signal is shown in FIG. 1. It can be seen that it is superimposed on the supply voltage Vcc so long as this voltage remains below the threshold voltage Vs. Beyond this value, the value of voltage of the POR control signal is zero.

Conventionally, the inhibiting means are formed by a flip-flop circuit whose resetting terminal receives the POR control signal and whose setting terminal receives a write request signal. The binary signal coming from the inhibiting means is used to activate a high voltage generator that produces the voltages necessary for programming and erasure of the memory cells. When the supply voltage is below the threshold voltage Vs, the binary signal is at a low level and the voltage generator is then made inoperative. Any write operation in the memory is therefore impossible.

The control circuit is the key element in the neutralizing device. FIG. 2 shows a known control circuit. It has a first means 1 to set the threshold value, connected by an input to a supply terminal Vcc and by its output to a ground terminal Gnd by means of a resistor R1. This means 1 comes on when the supply voltage becomes greater than an inherent threshold voltage which, in this case, is equal to the threshold value Vs.

In the example of FIG. 2, the means 1 is formed by a P type native transistor TP1 having its source connected to the supply terminal Vcc, its drain connected to the resistor R1 and its gate connected to the ground terminal Gnd. It may be recalled that a native transistor is a transistor that has not received any additional implantation in its conduction channel. Its conduction threshold voltage is in the range of 0.2 volts for an N type transistor and 1.3 volts for a P type transistor.

The control circuit furthermore has an inverter I1 connected between the output of the means 1 and an output terminal OUT through which the control signal is delivered. A starting capacitor C1 is connected between the supply terminal Vcc and the output terminal OUT to obtain the output level expected during the beginning of the build-up of the supply voltage.

In this example, the value of the conduction threshold of the transistor TP1 represents the inherent threshold voltage of the means 1. It is also equal to the threshold value Vs.

The operation of such a control circuit is well known to those skilled in the art. To put it briefly, so long as the value of the supply voltage Vcc is below the value of the conduction threshold of the transistor TP1, the value of the voltage at the input of the inverter I1 is zero. The output terminal OUT of the device then delivers a voltage equal to the supply voltage.

However, it must be noted that the operation of the inverter I1 is disturbed below a certain level of the supply voltage. Indeed, the two transistors forming the inverter are simultaneously off. The starting capacitor C1 makes it possible to impose a voltage equal to the supply voltage on the output of the inverter I1.

As soon as the supply voltage goes beyond the threshold voltage of the transistor TP1, the voltage at the input of the inverter I1 becomes roughly equal to the supply voltage. The voltage at the output terminal OUT of the device becomes zero. Conversely, when the supply voltage goes back below the threshold voltage of the transistor TP1, the voltage at the output terminal OUT is equal to the supply voltage.

This type of device has one major drawback: the threshold voltage of the control signal may vary substantially because of variations in the parameters proper to the methods of manufacture of the transistors. The lower the nominal value of the supply voltage, the greater will be the inconvenience caused by these variations of the threshold value.

Indeed, if we consider a memory working with a supply voltage of 1.8 volts, it must be ensured that the threshold voltage of the transistor TP1 is always below 1.8 volts. Preferably, in this case, a threshold voltage will be chosen equal to 1.5 volts. Such a value would make it possible to cope with small variations in the supply voltage and ensure the efficient running of the operations for writing in the memory.

Now, in practice, if it has chosen to give the transistor TP1 a threshold voltage whose nominal value is only 1.3 volts, it may happen that this real threshold voltage goes beyond 1.8 volts under unfavorable conditions of use such as low temperature, the difference between the real threshold voltage and the nominal threshold voltage being the accumulation of the differences in value due, firstly, to the conditions of manufacture, and secondly, to the conditions of use. It can therefore be seen that it is not possible to ensure the efficient working of the device.

SUMMARY OF THE INVENTION

The aim of the invention is to obtain a neutralizing circuit that is more reliable, especially in that it will depend far less on variations in the values of its components caused by manufacturing conditions.

For this purpose, according to the invention, there is provided an additional means to set the threshold value of the control signal, the additional means being parallel-connected with the conventional means.

Thus, an object of the invention is a device for neutralizing an electronic circuit designed to prevent any operation in the electronic circuit when this circuit is being powered or when it is being disconnected, the neutralizing device comprising a control circuit and a means to inhibit the operation of the electronic circuit, this control circuit activating the inhibiting means so long as the supply voltage remains below a threshold voltage or when the supply voltage goes below this threshold voltage, the control circuit comprising a first means connected by an input to a supply terminal and by its output to a ground terminal by means of a resistor, the first means coming on when the supply voltage becomes greater than a first threshold voltage proper to the first means, a first inverter connected between the output of the first means and an output terminal through which a control signal for the inhibiting means is delivered, and wherein the control circuit further comprises a second means connected between the supply terminal and the input of the first inverter, the second means coming on when the supply voltage becomes greater than a second threshold voltage proper to the second means, and wherein the first means comprise a P type native transistor, while the second means comprise an N type native transistor, the threshold voltage (Vs) of the control circuit being the smaller of the first and second threshold voltages that are respectively proper to the first and second means.

Since the P type transistor of the first means and the N type transistor of the second means are made during the same manufacturing process, the differences in conduction threshold that they display with respect to their nominal value will be opposite to each other.

If therefore, with respect to the chosen threshold value, the threshold value set by one of the first and second means is excessively high, it will be lower in the other means and it will be this other means that will be operative.

In a preferred embodiment, the first means is a P type native transistor having its source connected to the supply terminal, its drain to this resistor and to the input of this inverter and its gate to the ground terminal.

As for the second means, it may be an N type native transistor series-connected with a P type transistor.

BRIEF DESCRIPTION OF THE DRAWINGS

Other features and advantages of the invention are described in detail in the following description, given by way of a non-restricted example and made with reference to the appended drawings, of which:

FIG. 1 shows a timing diagram of the POR control signal coming from a control circuit of a neutralization circuit, FIG. 2 shows a control circuit in a prior art neutralization circuit, FIG. 3 shows a control circuit in a neutralization circuit according to the invention, and FIG. 4 shows an inverter for a control circuit according to the invention.

DETAILED DESCRIPTION

FIGS. 1 and 2 which form part of the prior art have been already described.

FIG. 3 shows a diagram of a control circuit according to the invention.

This control circuit is an improvement of the control circuit of FIG. 2 and shall be described with reference to FIG. 2.

This circuit comprises additional means 2 connected between the supply terminal Vcc and the output of the means 1. In the example of FIG. 3, the means 2 are formed by an N type native transistor TN1 having its drain and control gate connected to the supply terminal Vcc and its source connected to the source of a P type transistor TP2. Furthermore, the drain of the transistor TP2 is connected to the input of the inverter I1 and its control gate is connected to the ground terminal Gnd.

The differences, due to variations in the manufacturing method, between the real conduction thresholds of the N type native transistor TN1 and the P type transistor TP2 on the one hand and their nominal values on the other will be opposite to each other. The threshold value Vs of the POR control signal will be set either by the means 1 or by the means 2. This threshold value Vs will be equal to the lowest of the threshold voltages of the means 1 and 2.

Upon the turning on of one of the two means, the output of the inverter I1 changes it state and the voltage of the POR control signal becomes zero.

According to a preferred embodiment, two additional inverters I2 and I3 are added between the output of the inverter I1 and the output terminal OUT. These two inverters enable the correction of possible deformations of the POR control signal created by the starting capacitor C1 when the voltage at the output terminal OUT is zero.

A second embodiment shown in FIG. 4 comprises the use of an inverter I1 comprising a P type native transistor instead of a standard P type transistor, this being done for reasons of power consumption. Indeed, the conduction threshold of a P type native transistor is greater than that of a standard P type transistor. A native transistor is therefore turned off more swiftly than a standard transistor and thus enables power consumption to be limited.

In practice, for differences between real values and nominal values of the P type and N type native transistors corresponding to the most unfavorable manufacturing conditions, and for a temperature of use of −40 ° C., the threshold value obtained for a device of the invention was 1.6 volts, the device being supplied at 1.8 volts.

Under the same conditions, the threshold value obtained for a device as described here above with reference to the prior art would have exceeded the supply voltage value of 1.8 volts.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A device for neutralizing an electronic circuit designed to prevent any operation in the electronic circuit when the electronic circuit is being powered or when it is being disconnected, said neutralizing device comprising a control circuit and a means to inhibit the operation of the electronic circuit, said control circuit activating the inhibiting means so long as a supply voltage remains below a threshold voltage or when the supply voltage goes below said threshold voltage, said control circuit comprising a first means connected by an input to a supply terminal for supplying the supply voltage and by its output to a ground terminal by means of a resistor, said first means coming on when the supply voltage becomes greater than a first threshold voltage of said first means, a first inverter connected between the output of the first means and an output terminal through which a POR control signal for the inhibiting means is delivered, and wherein said control circuit further comprises a second means connected between the supply terminal and the input of the first inverter, said second means coming on when the supply voltage becomes greater than a second threshold voltage of said second means, and wherein the first means comprise a P type native transistor, while the second means comprise an N type native transistor, the threshold voltage of said control circuit being the smaller of said first and second threshold voltages of the first and second means respectively.

2. A neutralization device according to claim 1, wherein the first means is a P type native transistor having its source connected to the supply terminal, its drain connected to the resistor and its gate connected to a ground terminal.

3. A neutralization device according to claim 1, wherein the second means is an N type native transistor series-connected with a P type transistor, the drain and the gate of the N type native transistor being connected to the supply terminal, a drain of the P type transistor being connected to the resistor and a gate being connected to the ground terminal.

4. A neutralization device according to claim 1, wherein said first inverter comprises a P type transistor that is a native transistor.

5. A neutralization device according to claim 1, wherein two additional inverters are inserted between the output of the first inverter and the output terminal.

\* \* \* \* \*